US006198412B1

(12) United States Patent
Goyal

(10) Patent No.: US 6,198,412 B1
(45) Date of Patent: Mar. 6, 2001

(54) METHOD AND APPARATUS FOR REDUCED COMPLEXITY ENTROPY CODING

(75) Inventor: Vivek K. Goyal, Hoboken, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/234,562

(22) Filed: Jan. 20, 1999

(51) Int. Cl.[7] .................................................. H03M 7/40
(52) U.S. Cl. .............................. 341/50; 341/67; 382/190
(58) Field of Search ................................ 341/50, 67, 59, 341/75, 73; 358/261; 382/190; 395/200

(56) References Cited

U.S. PATENT DOCUMENTS 5,589,829 * 12/1996 Astle ........................................ 341/67
5,917,943 * 6/1999 Washizawa ............................ 382/190

OTHER PUBLICATIONS

P.G. Sherwood et al., "Error Protection of Wavelet Coded Images Using Residual Source Redundancy," Proc. of the 31st Asilomar Conference on Signals, Systems and Computers, Nov. 1997.
M.T. Orchard et al., "Redundancy Rate–Distortion Analysis of Multiple Description Coding Using Pairwise Correlating Transforms," Proc. IEEE Int. Conf. Image Proc., Santa Barbara, CA, Oct. 1997.
L. Ozarow, "On a source–coding problem with two channels and three receivers," Bell Syst. Tech. J., 59(8):1417–1426, 1980.
A.A. El Gamal et al., "Achievable Rates for Multiple Descriptions," IEEE Trans. Inform. Th., 28(6):851–857, Nov. 1982.
V.A. Vaishampayan, "Design of Multiple Scalar Quantizers," IEEE Trans. Inform. Th., 39(3):821–834, May 1993.
P. Subrahamanya et al., "Multiple Description Encoding of Images," Preprint, 1997.
Y. Wang et al., "Multiple Description Image Coding for Noisy Channels by Pairing Transform Coefficients," Proc. First IEEE SP Workshop on Multimedia Signal Processing, pp. 419–424, Princeton, NJ, Jun. 1997.
J.K. Wolf et al., "Source Coding for Multiple Descriptions," Bell Syst. Tech. J., 59(8):1417–1426, 1980.

(List continued on next page.)

Primary Examiner—Brian Young
Assistant Examiner—John Nguyen
(74) Attorney, Agent, or Firm—Ryan, Mason & Lewis, LLP

(57) ABSTRACT

Transform encoding techniques are disclosed which permit reductions in entropy coding memory requirements. In an illustrative embodiment, a selected discrete linear transform is applied to a discrete-valued version of an information signal to be encoded. The transform is selected such that it produces a transformed output that can be entropy coded using a reduced codeword memory without a substantial increase in entropy coding rate. The entropy coding may be, for example, scalar entropy coding which independently codes each of the components of the transformed discrete-valued version of the information signal, using a single entropy codebook for all of the components to be encoded. As another example, the entropy coding may utilize scalar entropy coding for a first subset of the components of the transformed discrete-valued version of the information signal, using a first codebook for each of the subset of components to be encoded, and vector entropy coding for a second subset of the components, using a second, larger codebook for each of the vectors to be encoded. Other types of entropy coding can also be improved through appropriate selection of the discrete transform.

22 Claims, 2 Drawing Sheets

OTHER PUBLICATIONS

J.–C. Batllo et al., "Asymptotic Performance of Multiple Description Transform Codes," IEEE Trans. Inform. Th., 43(2):703–707, 1997.

V.K. Goyal et al., "Quantized Overcomplete Expansions in $IR^N$: Analysis $S^{ynthesis\ and}$ Algorithms," IEEE Trans. Inform. Th.,, 44(1): Jan. 16, 1998.

T. Berger et al., "Minimum Breakdown Degradation in Binary Source Encoding" IEEE Trans. Inform. Th., 29(6):807, Nov. 1983.

R.M. Gray et al., "Source Coding for a Simple Network," Bell Syst. Tech. J., 53(8): 1681, Nov. 1974.

Z. Zhang et al., "New Results in Binary Multiple Descriptions," IEEE Trans. Inform. Th., 33(4):502, Jul. 1987.

R. Ahlswede, "The Rate–Distortion Region for Multiple Description Without Excess Rate," IEEE Trans. Inform. Th., 1995.

W.H.R. Equitz et al., "Successive Refinement of Information," IEEE Trans. Inform. Th., 37(2):269, Mar. 1991.

H.S. Witsenhausen et al., "Source Coding for Multiple Descriptions II: A Binary Source," Bell Syst. Tech. J., 60(10):2281, Dec. 1981.

V.A. Vaishampayan et al. "Design of Entropy–Contrained Multiple–Description Scalar Quantizers," IEEE Trans. Inform. Th., 40(1), Jan. 1994.

V.A. Vaishampayan et al., "Asymptotic Analysis of Multiple Description Quantizers," IEEE Trans. Inform. Th., 1994.

S.–M. Yang et al., "Low–Delay Communications for Rayleigh Fading Channels: An Application of the Multiple Description Quantizer," IEEE Trans. Comm., 43(11), Nov. 1995.

A. Ingle et al., "DPCM System Design for Diversity Systems with Applications to Packetized Speech," IEEE Trans. Sp. and Audio Proc., 3(1):48, Jan. 1995.

V.A. Vaishampayan et al., "Speech Predictor Design for Diversity Communication Systems," IEEE Workshop on Speech Coding for Telecommunications, Annapolis, MD, Sep. 1995.

V.A. Vaishampayan, "Application of Multiple Description Codes to Image and Video Transmission over Lossy Networks," 7th Int'l Workshop on Packet Video, Mar. 18–19, 1996, Brisbane, Australia.

R. Calderbank, I. Daubechies, W. Sweldens, and B.–L. Yeo, "Wavelet Transforms that Map Integers to Integers," Technical Report, Department of Mathematics, Princeton University, 1996.

V.K. Goyal et al., "Multiple Description Transform Coding: Robustness to Erasures Using Tight Frame Expansions," In Proc. IEEE Int. Symp. Inform. Theory, Aug. 1998.

V.K. Goyal and J Kovacevic, "Optimal Multiple Description Transform Coding of Gaussian Vectors," In Proc. IEEE Data Compression Conf., pp. 388–397, Mar. 1998.

A. Zandi et al., "CREW: Compression with Reversible Embedded Wavelets," Proc. IEEE Data Compression Conference, pp. 212–221, Snowbird, Utah, Mar. 1995.

J.M. Shapiro, "Embedded Image Coding Using Zerotrees of Wavelet Coefficients," IEEE Transactions on Signal Processing, vol. 41, No. 12, pp. 3445–3462, Dec. 1993.

* cited by examiner

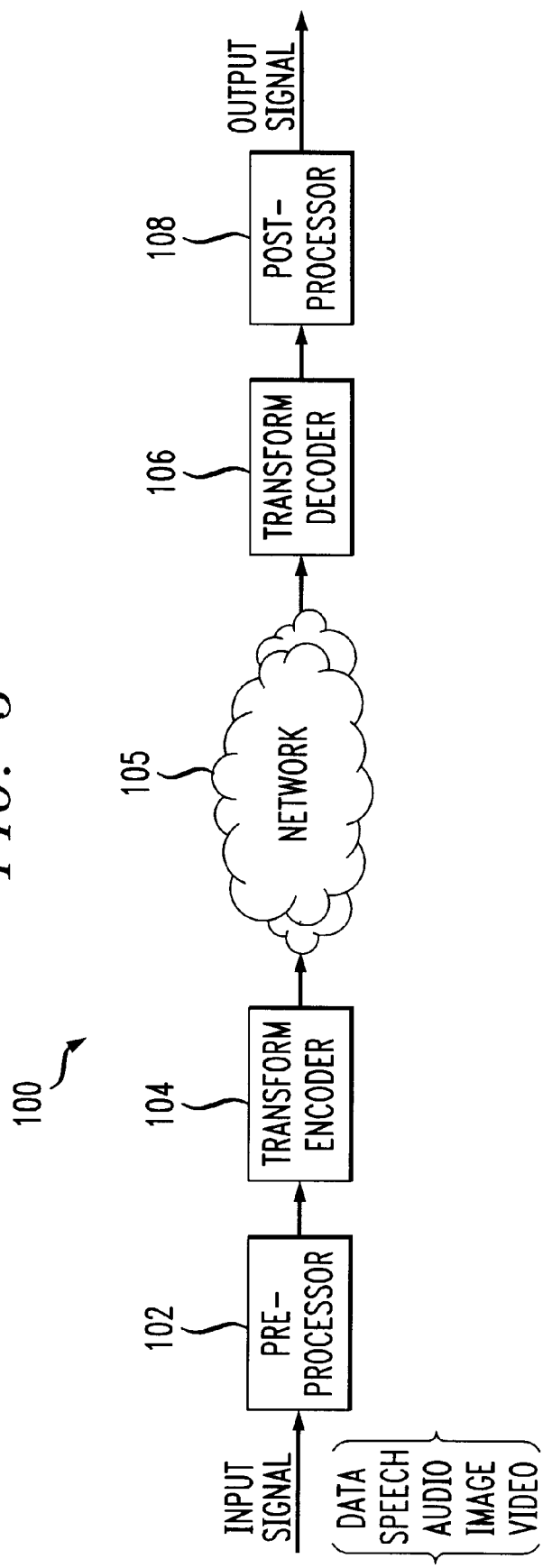

METHOD AND APPARATUS FOR REDUCED COMPLEXITY ENTROPY CODING

FIELD OF THE INVENTION

The present invention relates generally to encoding of audio, video, images, speech and other types of information signals, and more particularly to memory-efficient encoding techniques for use with such signals.

BACKGROUND OF THE INVENTION

FIG. 1 shows a conventional transform encoder 10 having a structure common to many well-known audio, video and image coding standards. This common encoder structure includes a linear transform 12, a scalar quantizer 14, and an entropy coder 16, arranged in that order. Transform coding of this type is generally viewed as a computationally efficient alternative to vector quantization. At high encoding rates, it is typically not the transform partitioning itself but the efficiency of the entropy coder that makes transform coding most useful. In the transform encoder 10, the transform is calculated on continuous-value data, i.e., "full precision" data prior to quantization, even though the data will ultimately be represented more coarsely. This also tends to increase the complexity of the subsequent entropy coding operations. Although developments such as zero-tree structures, described in J. M. Shapiro, "Embedded image coding using zero trees of wavelet coefficients," IEEE Trans. Signal Proc., 41(12):3445–3462, December 1993, mix the quantization and entropy coding operations to some degree, the transform is generally still calculated on continuous-value data.

In traditional transform coding of the type illustrated in FIG. 1, the input is generally a continuous-valued random vector sequence $\tilde{x}$, and it is presumed that the entropy coder 16 uses scalar entropy coding. The problem is then to design a continuous-valued linear transform $\tilde{T}$ such that $x=Q(\tilde{T}(\tilde{x}))$ is coded efficiently with scalar entropy coding, where $x=(x_1, x_2, \ldots x_n)$ is a discrete-valued random vector and Q is a scalar quantization function. The average rate for entropy coding of x is lower bounded by the entropy: $H(x) \leq R(x)$, where $H(\cdot)$ denotes the entropy of a random variable and $R(\cdot)$ denotes the rate obtained with an actual code. Subscripts on R will be used herein to distinguish between specific codes, when necessary. In addition, there is always a code that performs within one bit of the entropy, i.e., $R(x)<H(x)+1$. A Huffman code is an example of one such code.

Scalar entropy coding separately encodes each of the n components of x. This separate encoding can reduce the memory requirements and encoding complexity in many applications, but may also result in an increase in encoding rate. There are two causes of this increase. First, the dependencies between components may not be completely exploited. This is reflected by the following basic property of entropy:

$$H(x_1, x_2, \ldots x_n) \leq \sum_{i=1}^{n} H(x_i)$$

Second, when using an entropy code, one may do as much as one bit worse than the above-noted entropy bound, i.e., $R_0(x) \leq H(x)+1$. Thus, using n separate codes may waste n bits:

$$\sum_{i=1}^{n} R_i(x_i) \leq H(x_i) + n.$$

In the above-described traditional transform coding framework, the conventional approach is to pick the continuous-valued linear transform $\tilde{T}$ from among a set of orthogonal transforms, as described in, e.g., A. Gersho and R. M. Gray, "Vector Quantization and Signal Compression," Kluwer Acad. Pub., Boston, Mass. 1992. Use of a nonorthogonal transform would generally make the quantizer less effective. Among the orthogonal transforms, there is an essentially unique transform, known as a Karhunen-Loève transform, that minimizes the rate after scalar entropy coding. It was observed in M. T. Orchard et al., "Redundancy Rate-Distortion Analysis of Multiple Description Coding Using Pairwise Correlating Transforms," Proc. IEEE Int. Conf. Image Proc., Vol. 1, pp. 608–611, Santa Barbara, Calif., October 1997, that if a continuous-valued vector $\tilde{x}$ with independent components is first quantized and then transformed, i.e., such that $x=T(Q(\tilde{x}))$, then there is no need to limit the set of transforms. Generalizations to arbitrary dimension transform coding in the multiple description transform context are described in U.S. patent application Ser. No. 09/030,488 filed Feb. 25, 1998 in the name of inventors Vivek K. Goyal and Jelena Kovacevic and entitled "Multiple Description Transform Coding Using Optimal Transforms of Arbitrary Dimension."

The above-described conventional approaches can suffer from significant drawbacks. For example, in traditional transform coding, all of the degrees of freedom in the design are generally used to minimize the rate, with the result that no degrees of freedom are left for other manipulations.

It is therefore generally not possible, using the conventional transform coding techniques described above, to minimize the entropy coding rate and simultaneously pursue other important objectives such as memory reduction. Conventional encoding techniques are therefore unduly complex, and often consume excessive storage and computational resources.

SUMMARY OF THE INVENTION

The invention provides transform encoding techniques which allow entropy coding to be simplified, e.g., to be carried out with reduced memory requirements, and without a substantial increase in the entropy coding rate. In an illustrative embodiment, a selected discrete linear transform is applied to a discrete-valued version of an information signal to be encoded. The transform is selected such that it produces a transformed output that can be entropy coded using a reduced codeword memory, i.e., fewer codewords, relative to the codeword memory required to encode the information signal without the transform. In one example of a particular implementation of this embodiment, the entropy coding may be, for example, scalar entropy coding which independently codes each of the components of the transformed discrete-valued version of the information signal, using a single entropy codebook for all of the components to be encoded. In this case, the reduced codeword memory in terms of number of codewords required is given approximately by the following expression:

$$\left(\prod_{i=1}^{n} N_i\right)^{1/n},$$

in which n is the number of components in the discrete-valued version of the information signal, and $N_i$ is the number of codewords needed to encode the ith component of the information signal without the linear transform of the invention. This represents a reduction in required codeword memory by a factor of about 1/n.

As another example of a particular implementation of the illustrative embodiment, the entropy coding may utilize scalar entropy coding for a first subset of the components of the transformed discrete-valued version of the information signal, using a first codebook for each of the subset of components to be encoded, and vector entropy coding for a second subset of the components, using a second, larger codebook for each of the vectors to be encoded. In this case, the selected transform operates on the discrete-valued version of the information signal such that the components of the transformed discrete-valued version of the information signal have specified standard deviations. Other types of entropy coding can also be improved through appropriate selection of the discrete transform.

The improved coding techniques of the invention are suitable for use in any system with entropy coding. For example, the techniques of the invention are suitable for use in encoding all forms of discrete information for subsequent storage, transmission or processing.

BRIEF DESCRIPTION OF THE DRAWINGS

FIG. 5 is a block diagram of a communication system incorporating a transform encoder in accordance with the invention.

DETAILED DESCRIPTION OF THE INVENTION

Figure 1:
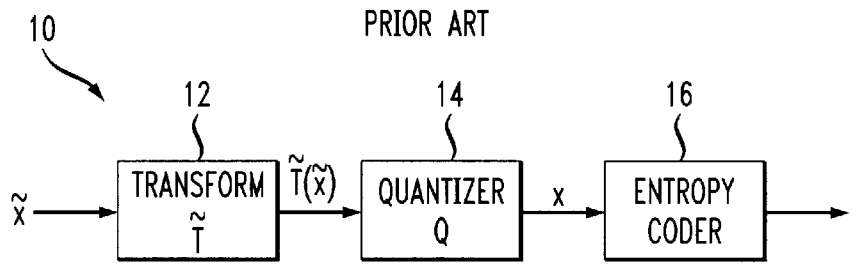
FIG. 1 shows a conventional transform encoder.

The invention will be illustrated below in conjunction with exemplary transform encoders and transform encoding applications. The techniques described may be applied to transmission of a wide variety of different types of signals, including data signals, speech signals, audio signals, image signals, and video signals, in either compressed or uncompressed formats. The term "vector" as used herein is intended to include any grouping of coefficients or other components representative of at least a portion of a signal.

The invention provides improved transform coding that allows one to simultaneously minimize the entropy coding rate while also manipulating the component probability density functions, and thus other parameters such as encoder memory requirements. As noted previously, in traditional transform coding, all of the degrees of freedom in the design are generally used to minimize the rate, with the result that none are left for reducing encoder memory requirements and other important manipulations.

In a transform encoder in which all of the entropy coding is assumed to be scalar, entropy coding memory requirements can be reduced by using one entropy codebook for all of the components to be encoded. However, in general, this will increase the rate because the variables and the codebook will be mismatched. Assume that x is a uniformly quantized version of a zero-mean Gaussian vector with independent components. Further assume that $x_i$ has standard deviation $\sigma_i$=1, 2, . . . n, and that each component has been truncated far away from the mean, such that the entropy codes are finite. The quantization step size determines the minimum rate: $R^*$=H(x). Since the components of x in this example are independent, scalar entropy coding does not suffer from the first type of undesirable rate increase described above, i.e., the potential failure to completely exploit dependencies between components is avoided, and $$\sum_{i=1}^{n} H(x_i) = H(x) = R^*$$

in this case. If each $x_i$ is coded with a codebook $C_i$ matched to the distribution of $x_i$, and the size of the codebook $C_i$, in terms of number of codewords required, is denoted by $N_i=|C_i|$, then the entropy coding rate is bounded by:

$$R^* \leq R_{separate} = \sum_{i=1}^{n} R_i(x_i) < R^* + n$$

and the memory required for the codebooks, measured in number of codewords, is given by:

$$M_{separate} = \sum_{i=1}^{n} N_i.$$

Using conventional techniques, it is possible to reduce the memory requirements associated with the entropy coding by designing a single codebook matched to the average distribution of the components of x. The resulting memory requirement in this case is given by:

$$M_{single\ entropy\ code,\ no\ transform} = \max(N_i),$$

but the entropy coding rate would be increased to $$R^* + \sum_{i=1}^{N} r_i \leq R_{single\ entropy\ code,\ no\ transform} < R^* + \sum_{i=1}^{N} r_i + n,$$

where each $r_i$ is nonnegative and measures the difference between the probability distribution of $x_i$ and the average distribution.

In accordance with the invention, a memory reduction can be provided without a rate increase. The invention selects a transform T such that scalar entropy coding of y=T(x) with a single codebook for all components results in a rate given approximately by $$R_{single\ entropy\ code,\ transform} = R_{separate}$$

and a memory requirement given by $$M_{single\ entropy\ code,transform} = \left(\prod_{i=1}^{n} N_i\right)^{1/n}.$$

This is a memory reduction by a factor of about $1/n$.

Alternative embodiments of the invention may use other entropy coding constraints to produce a memory reduction without a corresponding rate increase. For example, assume that x is a uniformly-quantized version of a zero-mean Gaussian vector with independent, identically distributed components. Denote the standard deviation of any component by $\sigma$, and again assume that each component has been truncated far from the mean. Denote the number of codewords in the codebook for component $x_i$ by N. In this type of embodiment, optimal scalar entropy codes for each component are identical, so no memory savings is possible using the previously-described techniques. However, the invention can still provide a memory reduction without an increase in rate if different size codebooks are used. Assume a codebook of size N is used to code scalars and a codebook of size $N^2$ is used to code vectors. In a case in which $n=4$, the size $N^2$ codebook is used to jointly code the pair $(x_1, x_2)$, and the size N codebook is used to separately encode scalar components $x_3$ and $x_4$, the memory requirement is given by:

$$M_{no\ transform} = N^2 + N$$

and the rate satisfies $$4h(\sigma) \leq R_{no\ transform} \leq [2h(\sigma)+1]+[h(\sigma)+1]+[h(\sigma)+1]=4h(\sigma)+3, \quad (1)$$

where $h(\sigma)$ is the entropy of a quantized version of a Gaussian random variable with standard deviation $\sigma$. The quantization step size is fixed and incorporated in h. The three terms on the right hand side in (1) are attributable to the coding of $(x_1, x_2)$, $x_3$ and $x_4$, respectively.

In accordance with the invention, an invertible transform T can be chosen such that the components of $y=T(x)$ have standard deviations $\sigma/2$, $\sigma/2$, $2\sigma$ and $2\sigma$, respectively. Then an optimal entropy code for $(y_1, y_2)$ can be found, with roughly $N^2/4$ elements. The common entropy code for $y_3$ and $y_4$ has roughly 2N elements. Thus, the memory requirement is:

$$M_{transform} = \frac{1}{4}N^2 + 2N$$

and the rate satisfies $$2h(\sigma/2)+2h(2\sigma) \leq R_{transform} \leq [2h(\sigma/2)+1]+[h(2\sigma)+1]+[2h(\sigma)+1]= 2h(\sigma/2)+2h(2\sigma)+3. \quad (2)$$

It can be shown that $h(\sigma/2)+h(2\sigma) \approx 2h(\sigma)$ when the quantization step size is small. Thus the rates in (1) and (2) are approximately equal (exactly equal when the quantization step size is small) and the invention has provided a memory reduction without a rate increase.

Figure 2:
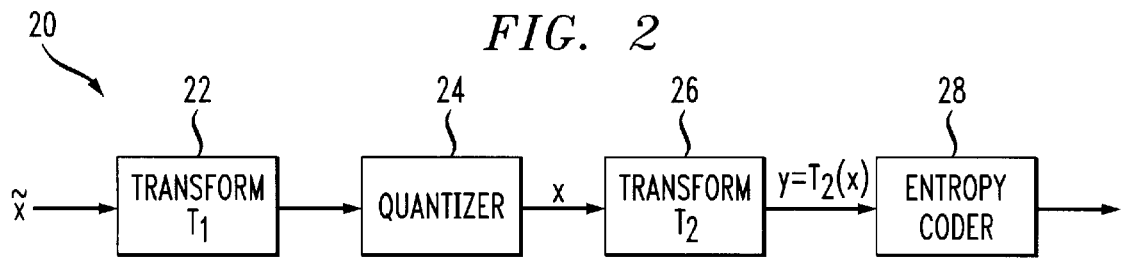
FIGS. 2, 3 and 4 each show an illustrative embodiment of a transform encoder in accordance with the invention.
Figure 3:
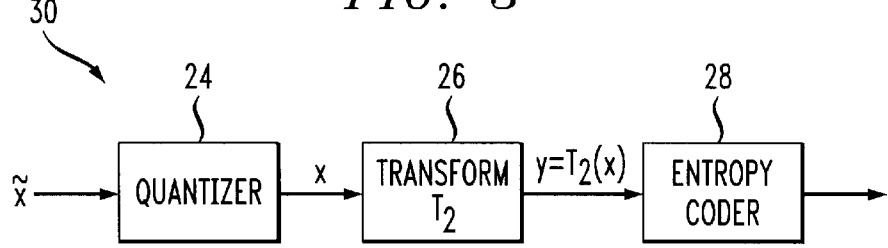
Figure 4:
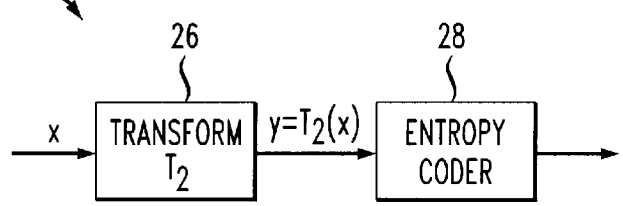

FIGS. 2, 3 and 4 show three illustrative embodiments of a transform encoder in accordance with the invention. In each of these embodiments, a transform element is included before the entropy coder in order to provide a memory reduction without a corresponding increase in coding rate, as in the examples previously described. FIG. 2 shows a transform encoder 20 in which a first transform $T_1$ is applied in transform element 22 to a continuous-valued random vector sequence $\tilde{x}$. The transformed output $T_1(\tilde{x})$ is then applied to a scalar quantizer 24, and the resulting discrete-valued vector x is applied to a second transform $T_2$ in transform element 26. The transformed output $y=T_2(x)$ of transform element 26 is then entropy coded in an entropy coder 28. FIG. 3 shows an alternative transform encoder 30 in which the continuous-valued random vector sequence $\tilde{x}$ is applied directly to the quantizer 24, the resulting discrete-valued vector x is then transformed to generate $y=T_2(x)$, and y is then entropy coded as in the FIG. 2 embodiment. FIG. 4 shows another alternative transform encoder 40 in which the input is the discrete-valued vector x and the quantizer is therefore eliminated. This embodiment is suitable for use in applications in which there is no corresponding continuous-valued random vector sequence $\tilde{x}$. In each of the embodiments of FIGS. 2, 3 and 4, the transform $T_2$ is the transform referred to in the previous examples, i.e., the transform selected to provide a reduction in the codeword memory required in the entropy coder.

The transform $T_2$ in the embodiments of FIGS. 2, 3 and 4 is an invertible discrete linear transform. Examples of such transforms are described in, e.g., the above-cited U.S. patent application Ser. No. 09/030,488 filed Feb. 25, 1998 in the name of inventors Vivek K. Goyal and Jelena Kovacevic. Starting with a linear transform T with a determinant of one, the first step in deriving a discrete version $\hat{T}$ is to factor T into "lifting" steps. This means that T is factored into a product of lower and upper triangular matrices with unit diagonals $T=T_1 T_2 \ldots T_k$. The discrete version of the transform is then given by:

$$\hat{T}(x_q)=[T_1[T_2 \ldots [T_k x_q]_\Delta]_\Delta]_\Delta, \quad (3)$$

where $[\cdot]_\Delta$ denotes rounding to the nearest multiple of the quantization step size $\Delta$. The lifting structure ensures that the inverse of $\hat{T}$ can be implemented by reversing the calculations in (3):

$$\hat{T}^{-1}(y)=[T_k^{-1} \ldots [T_2^{-1}[T_1^{-1}y]_\Delta]_\Delta]_\Delta.$$

The factorization of T is not unique. Different factorizations yield different discrete transforms, except in the limit as $\Delta$ approaches zero.

It is important to note that the illustrative embodiments of FIGS. 2, 3 and 4 apply a discrete transform to a discrete-valued vector x. If one were to instead apply a continuous transform first and then quantize, the use of a nonorthogonal transform could lead to non-cubic partition cells, which are inherently suboptimal among the class of partition cells obtainable with scalar quantization, as described in, e.g., A. Gersho and R. M. Gray, "Vector Quantization and Signal Compression," Kluwer Acad. Pub., Boston, Mass., 1992. However, as is apparent from the embodiment of FIG. 2, a transform encoder in accordance with the invention may include a continuous transform, i.e., transform $T_1$, followed by quantization and a discrete transform, i.e., transform $T_2$.

Additional details regarding invertible discrete-domain to discrete-domain transforms suitable for use with the present invention may be found in, e.g., R. Calderbank et al., "Wavelet transforms that map integers to integers," Appl. Computational Harmonic Anal., 5(3):332–369, July 1998, and A. Zandi et al., "CREW: Compression with reversible embedded wavelets," In Proc. IEEE Data Compression Conf., pp. 212–221, Snowbird, Utah, March 1995.

Transform encoders in accordance with the invention may be used in any application which makes use of entropy coding. FIG. 5 is an example of one such application, a communication system 100 in which encoded audio, video, images, speech, data or other information is transmitted over a network. In the system 100, an input signal is applied to a pre-processor 102. The input signal may represent, for example, a data signal, a speech signal, an audio signal, an image signal or a video signal, as well as various combinations of these and other types of signals. The operations performed by the pre-processor 102 will generally vary depending upon the application, and the pre-processor may be eliminated in other embodiments. The output of the preprocessor is a continuous-valued or discrete-valued vector which is applied to a transform encoder 104, which may be configured as shown in FIGS. 2, 3 or 4. The encoder 104 encodes the vector for transmission over one or more channels, using transform, quantization and entropy coding operations as previously described. The encoded vector is passed through a network 105, e.g., the Internet, a wireless network, asynchronous transfer mode (ATM) network, satellite network, telephone or cable network or any other suitable communication medium, to a decoder 106. The decoder 106 reconstructs the original vector from the received channel or channels. The output of the decoder 106 may be further processed in a post-processor 108 in order to generate a reconstructed version of the original input signal.

The encoder 104 may be implemented as, e.g., an audio coder which includes a conventional psychoacoustics processor, an image coder configured to interact with conventional preprocessing functions and perceptual table specifications, or a video coder which includes conventional motion compensation and motion estimation elements. It should be noted that these are only examples of applications of an encoder in accordance with the invention, and it will be apparent to those skilled in the art that numerous alternate configurations may also be used, in audio, image, video and other applications.

The above-described embodiments of the invention are intended to be illustrative only. For example, in embodiments of the invention in which there is an arbitrary distribution on the discrete vector x, a reduction in the number of codewords required for entropy coding may result in a small increase in encoding rate. When x is a finely quantized Gaussian vector, as described previously, there is no increase in rate. Alternative embodiments of the invention may utilize other coding structures and arrangements. Moreover, the invention may be used for a wide variety of different types of signals, and in numerous coding applications other than those described herein. These and numerous other alternative embodiments within the scope of the following claims will be apparent to those skilled in the art.

What is claimed is:

1. A method of encoding an information signal, comprising the steps of:

computing a linear transform of the information signal using a selected transform element; and entropy coding the transformed information signal, wherein the selected transform element has the property of producing a transformed output that can be entropy coded using a reduced number of codewords, relative to a number of codewords required to encode the information signal without the linear transform, and that can be entropy coded without a substantial increase in entropy coding rate relative to that required to encode the information signal without the linear transform.

2. The method of claim 1 wherein the selected transform element is a discrete linear transform element which operates on a discrete-valued version of the information signal.

3. The method of claim 2 further including the step of quantizing a continuous-valued version of the information signal to generate the discrete-valued version of the information signal.

4. The method of claim 2 further including the steps of transforming a continuous-valued version of the information signal in a first transform element, and quantizing the transformed continuous-valued version of the information signal to generate the discrete-valued version of the information signal.

5. The method of claim 2 wherein the entropy coding step includes performing scalar entropy coding by independently coding each of the components of the transformed discrete-valued version of the information signal, using a single entropy codebook for all of the components to be encoded.

6. The method of claim 3 wherein the reduced number of codewords is given approximately by the following expression:

$$\left(\prod_{i=1}^{n} N_i\right)^{1/n},$$

in which n is the number of components in the discrete-valued version of the information signal, and $N_i$ is the number of codewords needed to encode the ith component of the information signal without the linear transform.

7. The method of claim 2 wherein the entropy coding step includes performing scalar entropy coding on a first subset of the components of the transformed discrete-valued version of the information signal using a first codebook, and performing vector entropy coding on a second subset of the components of the transformed discrete-valued version of the information signal using a second codebook.

8. The method of claim 7 wherein the first codebook has a size in terms of number of codewords which is smaller than a corresponding size of the second codebook.

9. The method of claim 7 wherein the selected transform operates on the discrete-valued version of the information signal such that the components of the transformed discrete-valued version of the information signal have specified standard deviations.

10. An apparatus for encoding an information signal, comprising:

a transform element for computing a linear transform of the information signal; and an entropy coder for entropy coding the transformed information signal, wherein the transform element has the property of producing a transformed output that can be entropy coded using a reduced number of codewords, relative to a number of codewords required to encode the information signal without the linear transform, and that can be entropy coded without a substantial increase in entropy coding rate relative to that required to encode the information signal without the linear transform.

11. The apparatus of claim 10 wherein the selected transform element is a discrete linear transform element which operates on a discrete-valued version of the information signal.

12. The apparatus of claim 11 further including a quantizer for quantizing a continuous-valued version of the information signal to generate the discrete-valued version of the information signal.

13. The apparatus of claim 11 further including an additional transform element for transforming a continuous-valued version of the information signal, and a quantizer for quantizing the transformed continuous-valued version of the information signal to generate the discrete-valued version of the information signal.

14. The apparatus of claim 11 wherein the entropy coder performs scalar entropy coding by independently coding each of the components of the transformed discrete-valued version of the information signal, using a single entropy codebook for all of the components to be encoded.

15. The apparatus of claim 11 wherein the reduced number of codewords is given approximately by the following expression:

$$\left(\prod_{i=1}^{n} N_i\right)^{1/n},$$

in which n is the number of components in the discrete-valued version of the information signal, and $N_i$ is the number of codewords needed to encode the ith component of the information signal without the linear transform.

16. The apparatus of claim 11 wherein the entropy coder performs scalar entropy coding on a first subset of the components of the transformed discrete-valued version of the information signal using a first codebook, and performs vector entropy coding on a second subset of the components of the transformed discrete-valued version of the information signal using a second codebook.

17. The apparatus of claim 16 wherein the first codebook has a size in terms of number of codewords which is smaller than a corresponding size of the second codebook.

18. The apparatus of claim 16 wherein the selected transform operates on the discrete-valued version of the information signal such that the components of the transformed discrete-valued version of the information signal have specified standard deviations.

19. A method of encoding an information signal, comprising the steps of:

computing a linear transform of the information signal using a selected transform element, wherein the selected transform element comprises a discrete linear transform element which operates on a discrete-valued version of the information signal; and entropy coding the transformed information signal, wherein the selected transform element has the property of producing a transformed output that can be entropy coded using a reduced number of codewords relative to a number of codewords required to encode the information signal without the linear transform, and further wherein the reduced number of codewords is given approximately by the following expression:

$$\left(\prod_{i=1}^{n} N_i\right)^{1/n},$$

in which n is the number of components in the discrete-valued version of the information signal, and $N_i$ is the number of codewords needed to encode the ith component of the information signal without the linear transform.

20. An apparatus for encoding an information signal, comprising:

a transform element for computing a linear transform of the information signal, the transform element comprising a discrete linear transform element which operates on a discrete-valued version of the information signal; and an entropy coder for entropy coding the transformed information signal, wherein the transform element has the property of producing a transformed output that can be entropy coded using a reduced number of codewords relative to a number of codewords required to encode the information signal without the linear transform, and further wherein the reduced number of codewords is given approximately by the following expression:

$$\left(\prod_{i=1}^{n} N_i\right)^{1/n},$$

in which n is the number of components in the discrete-valued version of the information signal, and $N_i$ is the number of codewords needed to encode the ith component of the information signal without the linear transform.

21. A method of encoding an information signal, comprising the steps of:

computing a linear transform of the information signal using a selected transform element, wherein the selected transform element comprises a discrete linear transform element which operates on a discrete-valued version of the information signal; and entropy coding the transformed information signal, wherein the selected transform element has the property of producing a transformed output that can be entropy coded using a reduced number of codewords relative to a number of codewords required to encode the information signal without the linear transform, and further wherein the entropy coding step includes performing scalar entropy coding on a first subset of the components of the transformed discrete-valued version of the information signal using a first codebook, and performing vector entropy coding on a second subset of the components of the transformed discrete-valued version of the information signal using a second codebook.

22. An apparatus for encoding an information signal, comprising:

a transform element for computing a linear transform of the information signal, the transform element comprising a discrete linear transform element which operates on a discrete-valued version of the information signal; and an entropy coder for entropy coding the transformed information signal, wherein the transform element has the property of producing a transformed output that can be entropy coded using a reduced number of codewords relative to a number of codewords required to encode the information signal without the linear transform, and further wherein the entropy coder performs scalar entropy coding on a first subset of the components of the transformed discrete-valued version of the information signal using a first codebook, and performs vector entropy coding on a second subset of the components of the transformed discrete-valued version of the information signal using a second codebook.

* * * * *